US010553551B2

(12) United States Patent
Kuo et al.

(10) Patent No.: US 10,553,551 B2
(45) Date of Patent: Feb. 4, 2020

(54) IMPEDANCE COMPENSATION OF FLIP CHIP CONNECTION FOR RF COMMUNICATIONS

(71) Applicant: SPEEDLINK TECHNOLOGY INC., Cupertino, CA (US)

(72) Inventors: Che-Chun Kuo, Atlanta, GA (US); Taiyun Chi, Atlanta, GA (US); Thomas Chen, Atlanta, GA (US)

(73) Assignee: SPEEDLINK TECHNOLOGY INC., Cupertino, CA (US)

( * ) Notice: Subject to any disclaimer, the term of this patent is extended or adjusted under 35 U.S.C. 154(b) by 0 days.

(21) Appl. No.: 15/974,542

(22) Filed: May 8, 2018

(65) Prior Publication Data

US 2019/0348379 A1    Nov. 14, 2019

(51) Int. Cl.
*H01Q 1/22* (2006.01)
*H01L 23/66* (2006.01)
*H01L 23/00* (2006.01)

(52) U.S. Cl.
CPC ............. *H01L 23/66* (2013.01); *H01L 24/48* (2013.01); *H01L 2223/6677* (2013.01); *H01L 2224/73204* (2013.01); *H01L 2924/1421* (2013.01); *H01L 2924/15311* (2013.01); *H01L 2924/30111* (2013.01)

(58) Field of Classification Search
CPC ......... H01L 23/52; H01L 23/48; H01L 23/66; H01L 23/36; H01L 23/00; H01L 24/48; H01Q 1/3291; H01Q 1/3233; H01Q 1/2216; H01Q 1/40; H01Q 9/26
See application file for complete search history.

(56) References Cited

U.S. PATENT DOCUMENTS

| 6,639,322 | B1* | 10/2003 | Welstand | H01L 21/563 257/728 |
| 2002/0113320 | A1* | 8/2002 | Akram | H01L 23/49822 257/778 |
| 2006/0091542 | A1* | 5/2006 | Zhao | H01L 21/565 257/738 |
| 2009/0153428 | A1* | 6/2009 | Rofougaran | H01L 23/66 343/787 |
| 2010/0019379 | A1* | 1/2010 | Zhao | H01L 21/4871 257/713 |

* cited by examiner

*Primary Examiner* — Hoang V Nguyen
(74) *Attorney, Agent, or Firm* — Womble Bond Dickinson (US) LLP (57) ABSTRACT

A flip chip IC device utilized in RF transceivers includes a bare die having a number of metalized pads and each metalized pad has a solder ball deposited thereon. The flip chip IC device further includes a substrate having a number of connector pads corresponding to the metalized pads. The connector pads are connected to one or more electronic components disposed on the substrate via a number of connector strips. The bare die is flipped up-side-down such that the metalized solder pads are aligned and connected with the connector pads of the substrate via the solder balls. At least one of the connector strips includes a strip section having an uneven strip width configured to compensate an impedance of a transmission line formed based on a connection between a metalized pad of the bare die and a connector pad of the substrate to match predetermined impedance.

17 Claims, 10 Drawing Sheets

IMPEDANCE COMPENSATION OF FLIP CHIP CONNECTION FOR RF COMMUNICATIONS

FIELD OF THE INVENTION

Embodiments of the present invention relate generally to radio frequency (RF) communications. More particularly, embodiments of the invention relate to impedance compensation of flip chip connection for RF communications.

BACKGROUND

Figure 1A:
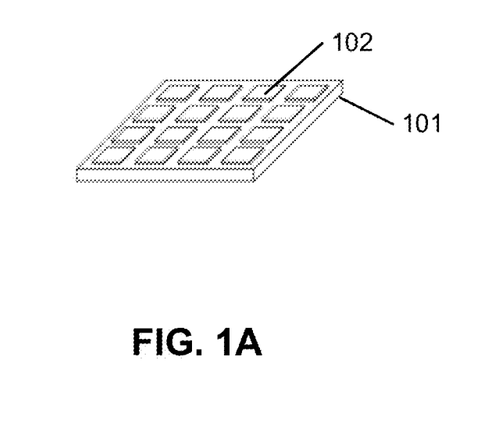
FIGS. 1A-1D are diagrams illustrating fabrication processes of a flip chip IC device.
Figure 1B:
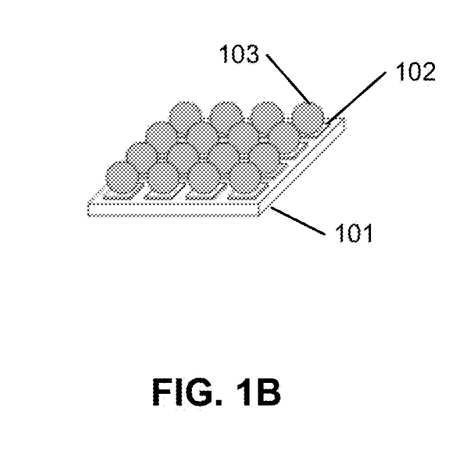

Processing a flip chip is similar to conventional IC fabrication, with a few additional steps. Near the end of the manufacturing process, the attachment pads 102 of chip 101 are metalized to make them more receptive to solder as shown in FIG. 1A. A small dot of solder such as solder ball 103 is then deposited on each metalized pad such as pad 102 as shown in FIG. 1B. The chips are then cut out of the wafer as normal.

Figure 1C:
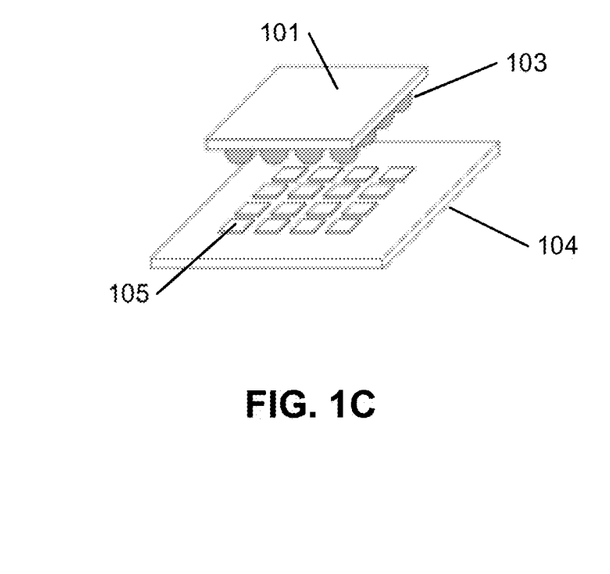
Figure 1D:
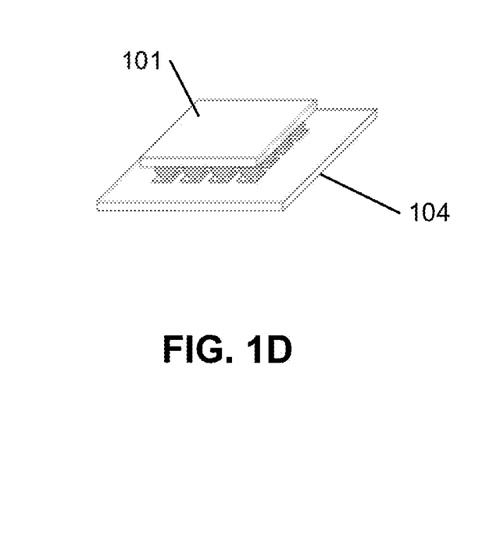

To attach the flip chip 101 into a circuit, the chip 101 is inverted to bring the solder dots down onto connectors (e.g., connector pad 105) on the underlying electronics or circuit board 104 as shown in FIG. 1C. The solder is then re-melted to produce an electrical connection as shown in FIG. 1D. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system. The underfill distributes the thermal expansion mismatch between the chip and the board, preventing stress concentration in the solder joints which would lead to premature failure.

Flip chip connection is the most popular for commercial integrated circuit package to date; conductive bumps which are connected from bare die side to substrate side for electric signal propagation. The advantage of flip chip interconnection is short signal propagation path, low loss and impedance controllable. However, in millimeter wave frequency range, flip chip interconnection still has certain significant parasitic effect and therefore proper impedance compensation for achieving desire impedance is necessary.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a flip chip IC device utilized in RF transceivers includes a bare die having a number of metalized pads and each metalized pad has a solder ball deposited thereon. The flip chip IC device further includes a substrate having a number of connector pads corresponding to the metalized pads. The connector pads are connected to one or more electronic components disposed on the substrate via a number of connector strips. The bare die is flipped up-side-down such that the metalized solder pads are aligned and connected with the connector pads of the substrate via the solder balls. At least one of the connector strips includes a strip section having an uneven strip width configured to compensate an impedance of a transmission line formed based on a connection between a metalized pad of the bare die and a connector pad of the substrate to match a predetermined impedance.

In one embodiment, the connector strips include a first ground strip, a second ground strip, and a signal strip disposed between the first ground strip and the second ground strip. The signal strip includes a first section coupled to a first connector pad of the substrate, a second section coupled to the first section, and a third section coupled to the second section and one or more electronic components disposed on the substrate. The second section has a second strip width that is different than a first strip width of the first section. In one embodiment, the second strip width is different than a third strip width of the third section.

In one embodiment, when an impedance of the transmission line is associated with capacitive impedance, the second strip width of the second section of the signal strip is wider than the first strip width or the third strip width. The length of the second section is shorter than or equal to a quarter of a wavelength associated with an operating frequency of the RF transceiver. Alternatively, a gap between the signal strip and the first ground strip or the second ground strip is wider in at least a portion of the first and second ground strips, for example, by cutting out a cavity on the first strip and/or the second strip.

According to another embodiment, when the impedance of the transmission line is associated with inductive impedance, the second strip width of the second section of the signal strip is narrower than the first strip width or the third strip width. Alternatively, the first ground strip and/or the second ground strip include a cavity cut out to allow the second section of the signal strip to expand into the cavities of the first ground strip and the second ground strip. The width of the cavity is shorter than or equal to a quarter wavelength associated with an operating frequency of the RF transceiver.

Figure 2A:
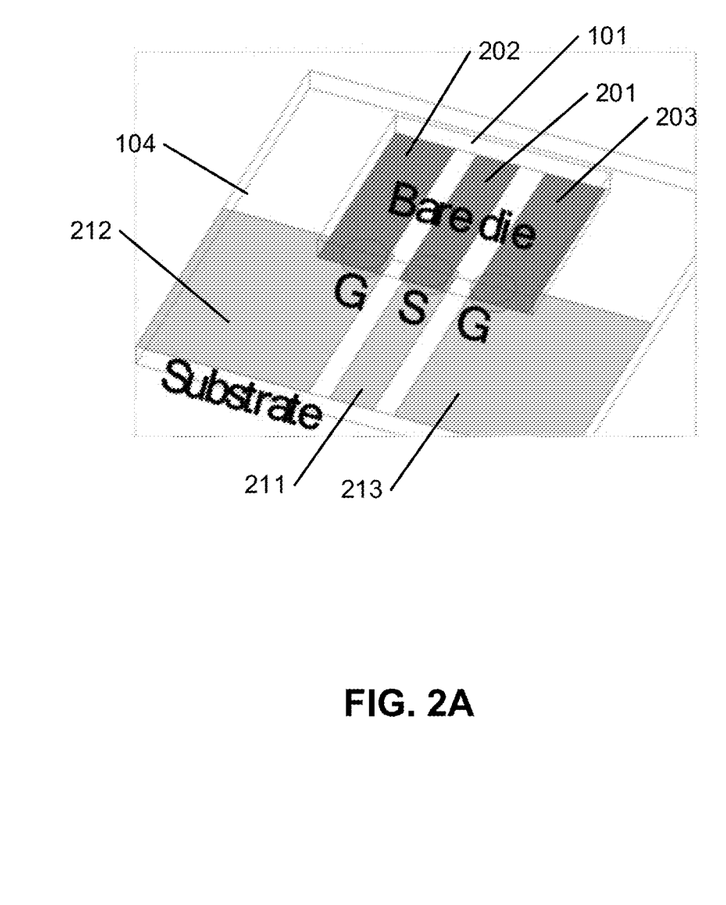
FIGS. 2A-2B show perspective view and top view of a flip chip IC device.
Figure 2B:
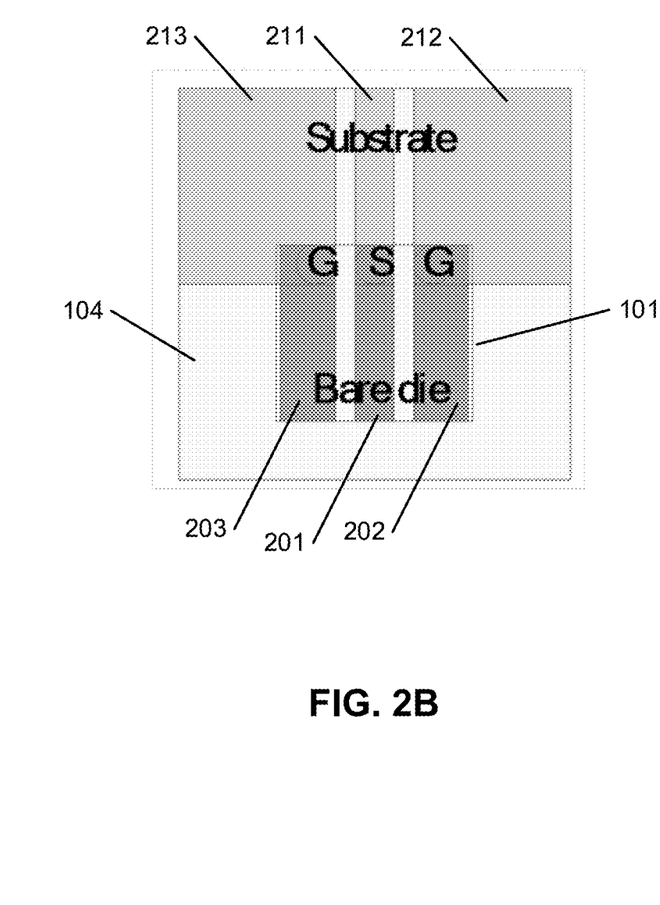
Figure 3:
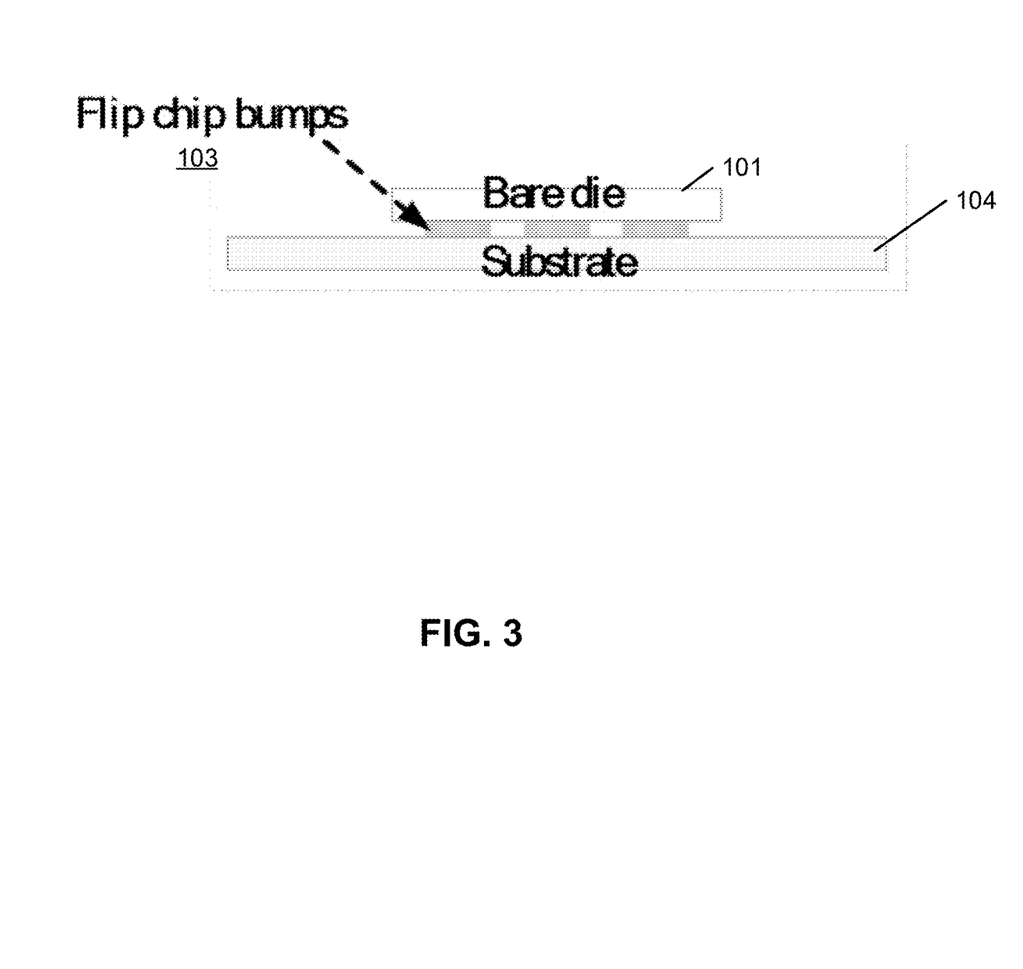
FIG. 3 shows a side view of a flip chip IC device.

FIG. 2A shows a perspective view of a flip chip IC device for RF transceivers. FIG. 2B shows a top view of the IC device. Referring to FIGS. 2A and 2B, in this example, chip 101 includes at least a signal die pad 201, a first ground die pad 202, and a second ground die pad 203. Substrate 104 includes a signal connector pad 211, a first ground connector pad 212, and a second ground connector pad 213. Chip 101 is then flipped and aligned with substrate 104 such that signal die pad 201, first ground die pad 202, and second ground die pad 203 are aligned and connected with signal connector pad 211, first ground connector pad 212, and second ground connector pad 213 via respective solder balls or solder bumps, respectively. Each of the signal connector pad 211, first ground connector pad 212, and second ground connector pad 213 extend to be connected to external electronic components disposed on substrate 104 via respective strips (not shown). A strip extended from signal connector pad 211 is referred to as a signal strip. A strip extended from first ground connector pad 212 is referred to as a first ground strip. A strip extended from second ground connector pad 213 is referred to as a second ground strip. FIG. 3 shows a side view of the IC device.

Figure 4:
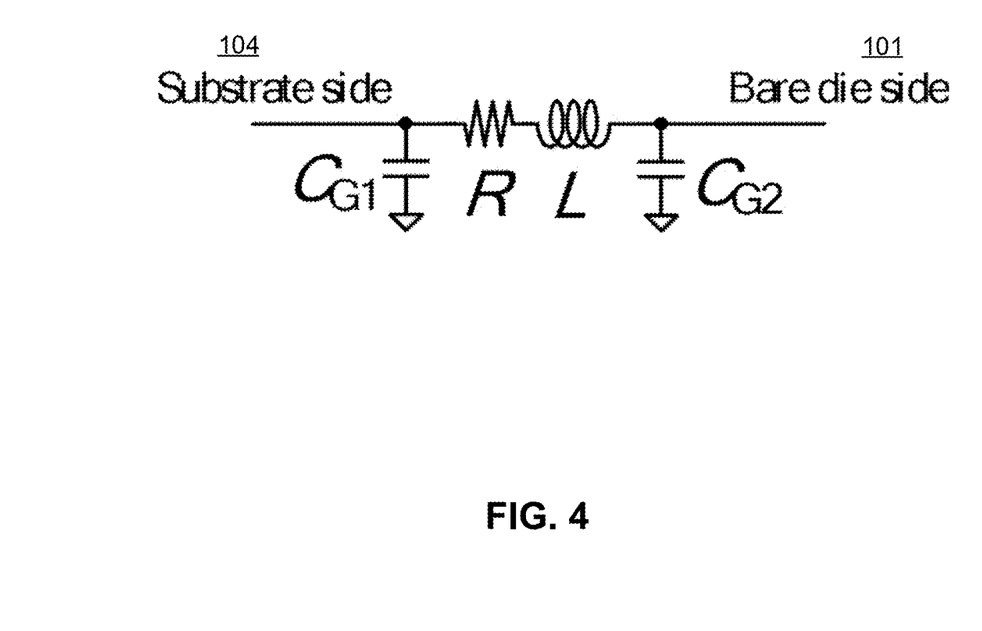
FIG. 4 is a schematic diagram illustrating an equivalent circuit of a transmission line of a flip chip IC device.

FIG. 4 shows an equivalent circuit representing the IC device as shown in FIGS. 2A-2B. Referring to FIG. 4, $C_{G1}$ and $C_{G2}$ represent the discontinuous junction effect. Resistor R and inductor L represent bump length and loss effect.

According to one embodiment, a transmission line is formed between a connector pad of substrate 104 and a die pad (e.g., metalized pad) of die 101 due to high frequency signals. The impedance of the transmission line may not match the desired impedance of die 101 and/or substrate 104. Such desired impedance is approximately 50 ohms. In order to compensate the mismatched impedance, the signal strip on substrate 104 may be configured with uneven strip width, which in turn transforms into different impedance, either high impedance or low impedance. In one embodiment, if the transmission line impedance is substantially inductive impedance, high impedance compensation is needed.

Figure 5:
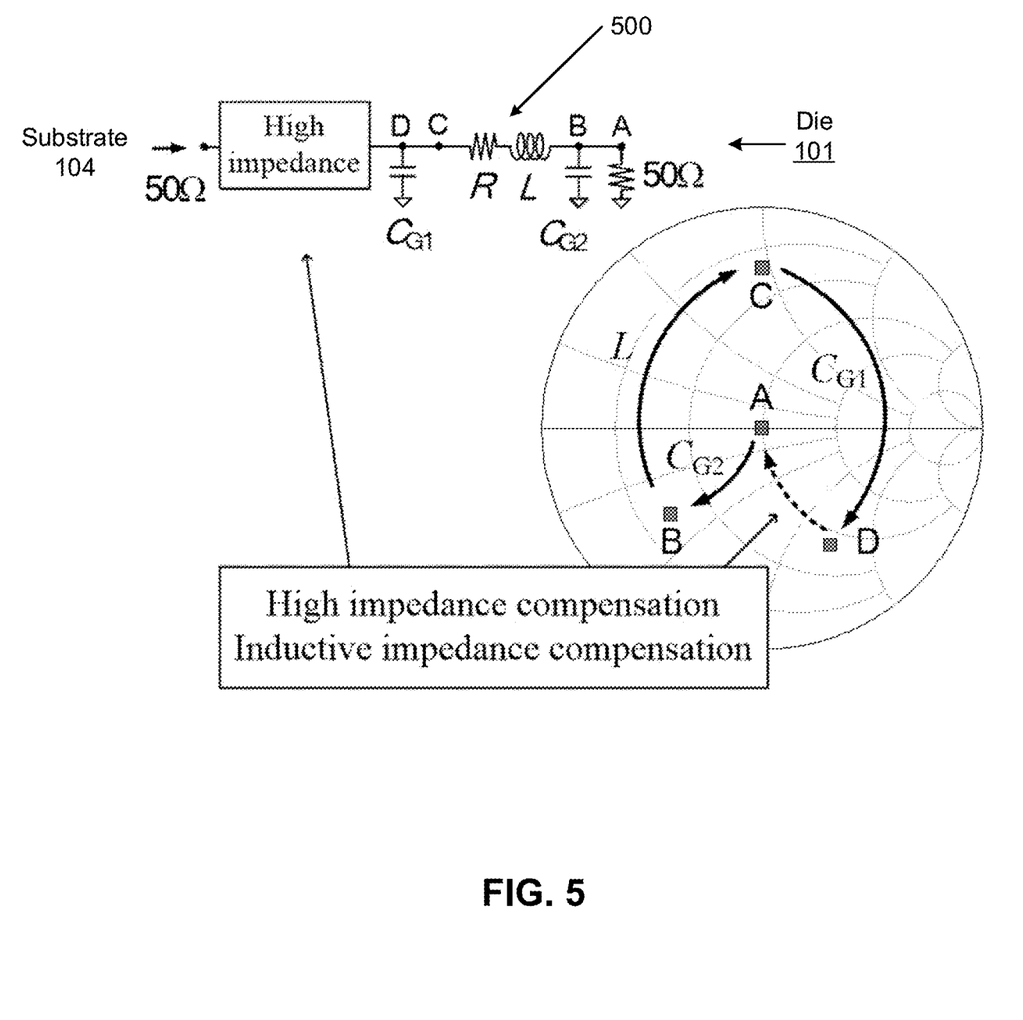
FIG. 5 shows a Smith chart of a transmission line of a flip chip IC device according to one embodiment.

Referring now to FIG. 5, the impedance of a transmission line 500 between die 101 and substrate 104 can be determined using a Smith chart algorithm. The equivalent circuit as shown in FIG. 4 contributes significant effect especially at millimeter wave frequency. Depends on the geometry structure, every elements in the equivalent circuit will have different values consequentially. The inductive and/or capacitive impedance properties will be shown from the equivalent circuit model. Thus, dependent upon the impedance of the transmission line is inductive impedance or capacitive impedance in nature, high impedance/inductive impedance compensation or low impedance/capacitive impedance compensation may be deployed. The type of transmission line impedance can be determined using a Smith chart as shown in FIG. 5.

Smith chart a graphical aid or nomogram designed for electrical and electronics engineers specializing in RF engineering to assist in solving problems with transmission lines and matching circuits. The Smith chart can be used to simultaneously display multiple parameters including impedances, admittances, reflection coefficients, scattering parameters, noise figure circles, constant gain contours and regions for unconditional stability, including mechanical vibrations analysis. The Smith chart is most frequently used at or within the unity radius region. However, the remainder is still mathematically relevant, being used, for example, in oscillator design and stability analysis.

Referring back to FIG. 5, the Smith chart shows the impedance changes from point A to point D along the equivalent circuit of the transmission line 500. When the impedance of point ends at the top half of the Smith chart the transmission line impedance is in an inductive impedance type. When the impedance of point D ends at the lower half of the Smith chart, the transmission line impedance is in a capacitive impedance type. In the example as shown in FIG. 5, point D ends at the lower half of the Smith chart, so the transmission line impedance is capacitive impedance. Therefore, it requires an inductive impedance compensation (also referred to as high impedance compensation), which is represented by a dash line from point D back to point A on the Smith chart.

Figure 6A:
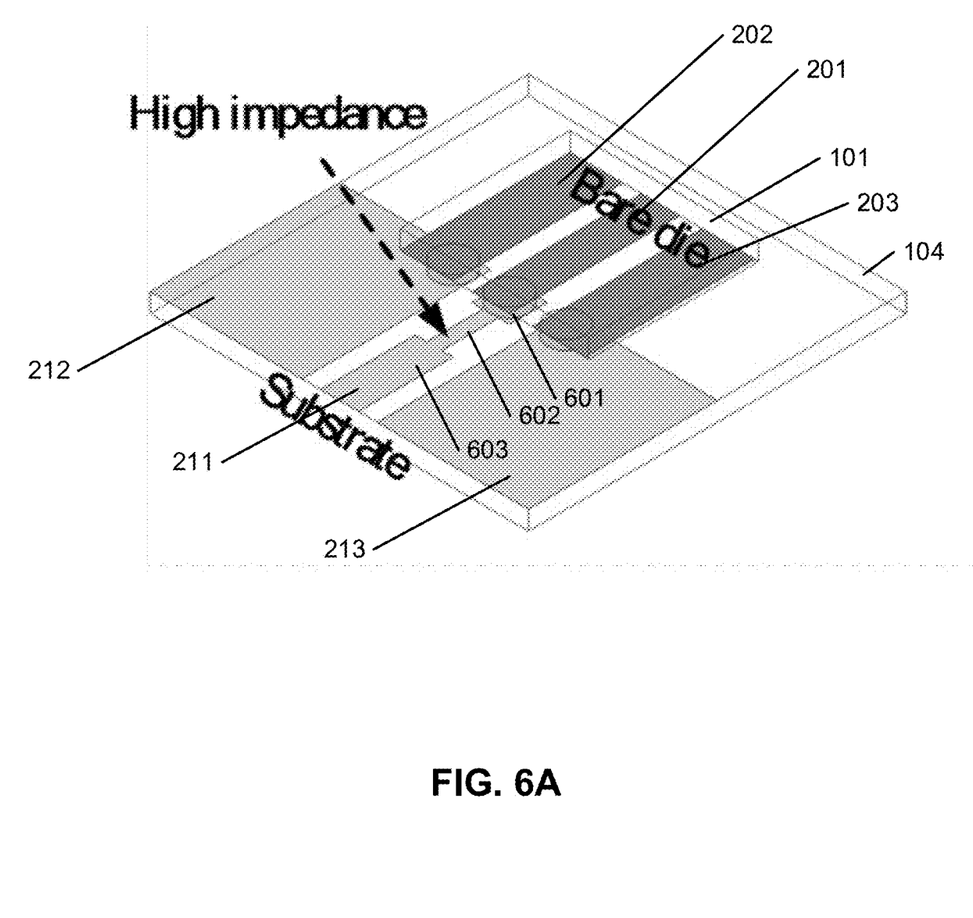
FIGS. 6A and 6B show perspective views of a flip chip IC device according to one embodiment of the invention.

According to one embodiment, a strip width of a signal strip connecting a connector pad to an electronic component disposed on a substrate is altered to achieve higher impedance on the signal strip to compensate capacitive impedance as a result of a transmission line. FIG. 6A shows a perspective view of an IC device with high/inductive impedance compensation according to one embodiment. Referring to FIG. 6A, in this example, substrate 104 includes first ground strip 212, signal strip 211, and second ground strip 213. In one embodiment, the strip width of signal strip 211 is altered to alter the impedance of signal strip 211 (e.g., uneven strip width).

In one embodiment, signal strip 211 includes a first strip section 601, a second strip section 602, and a third strip section 603. The first section 601 (e.g., connector pad) is coupled to a solder ball or solder bump that connects to a corresponding die pad 201. The third section 603 is coupled to an electronic component disposed on substrate 104 (not shown). In one embodiment, the strip width of second section 602 is narrower than the strip width of first section 601 or third section 602. As a result, the impedance of signal strip 211 is increased to become relatively high impedance. By narrowing the width of the second section 602, a gap (e.g., a non-conductive or dielectric gap) between signal strip 211 and ground strips 212-213 has been enlarged to achieve the same result. In one embodiment, the length of second section 602 is shorter than or equal to a quarter wavelength (wavelength/4) associated with an operating frequency of a corresponding RF transceiver. The narrowed strip width of the section 602 is configured dependent upon the amount of mismatched impedance.

Figure 6B:
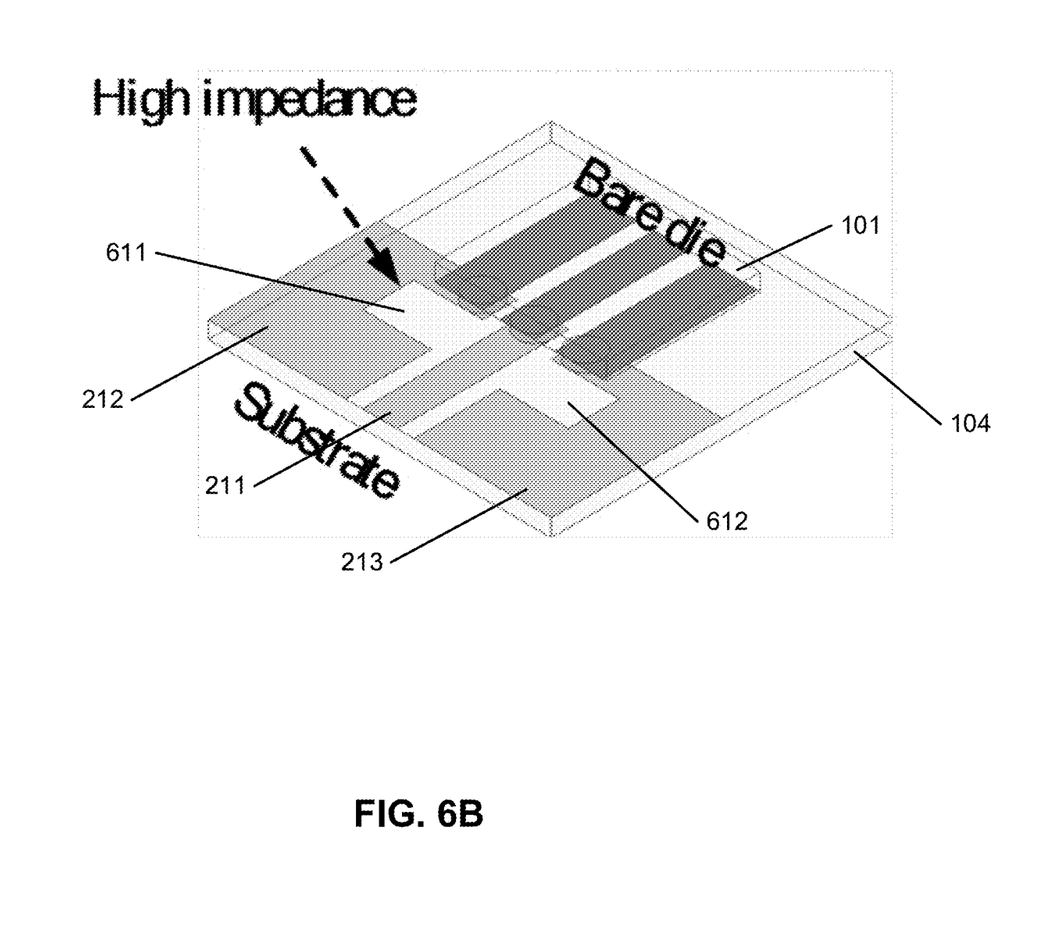

Alternatively, according to another embodiment as shown in FIG. 6B, the gap between signal strip 211 and ground strips 212-213 can also be increased by cutting out a cavity on ground strips 212-213. Referring to FIG. 6B, in this example, cavity 611 is cut out from ground strip 212 and cavity 612 is cut out from ground strip 213. Cavities 611-612 are configured symmetrically on both sides of signal strip 211. In one embodiment, the width of cavities 611-612 are shorter than or equal to a quarter of wavelength (wavelength/4) associated with an operating frequency of a corresponding RF transceiver.

Figure 7:
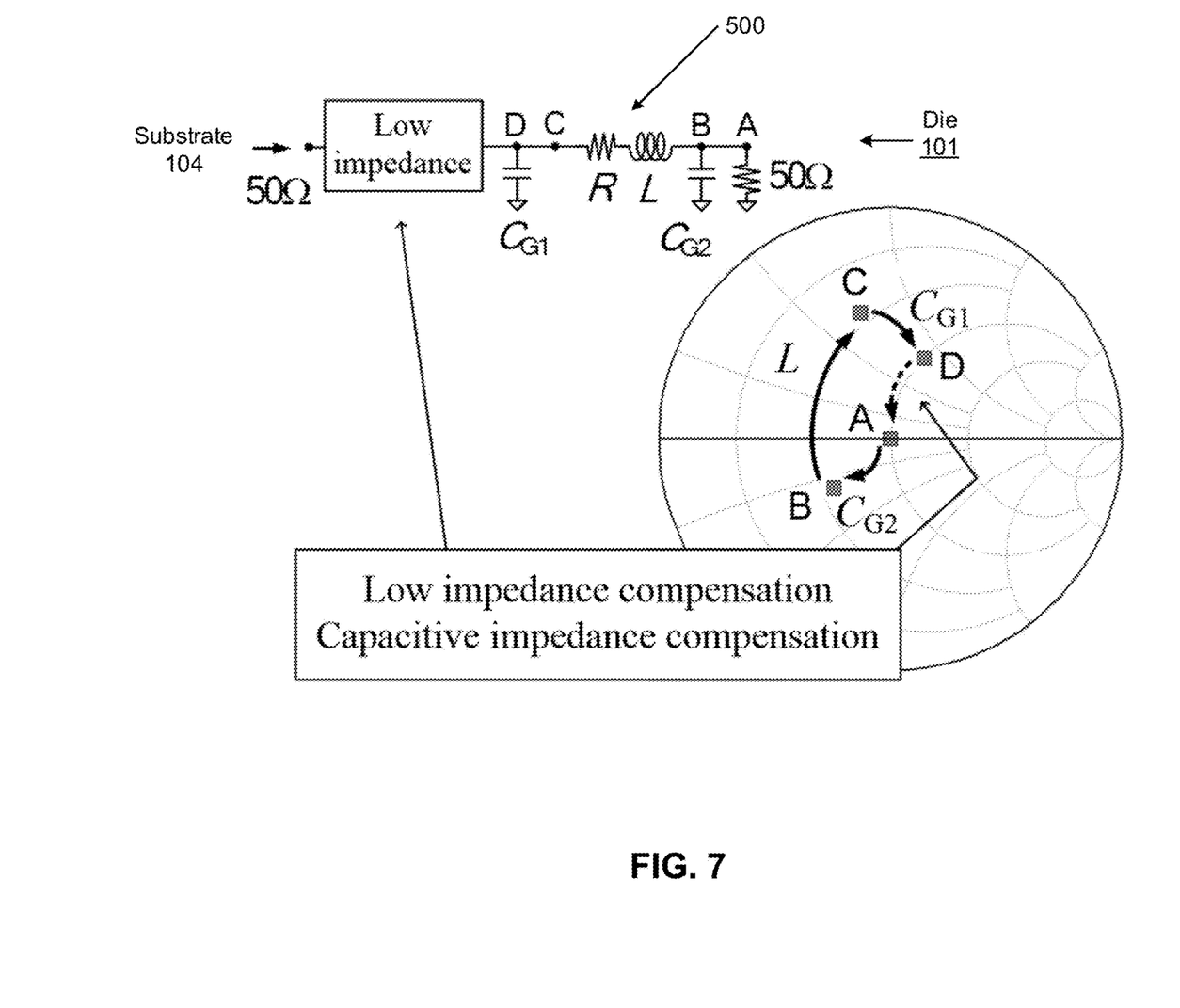
FIG. 7 shows a Smith chart of a transmission line of a flip chip IC device according to another embodiment.

According to another embodiment, when the Smith chart shows that the transmission line impedance is a type of inductive impedance as shown in FIG. 7, capacitive impedance compensation may be employed to compensate the transmission line impedance to match a predetermined impedance (e.g., 50 ohms). As shown in FIG. 7, the point D ends at the upper half of the Smith chart, which indicates the impedance on the transmission line is inductive impedance (e.g., high impedance).

Figure 8A:
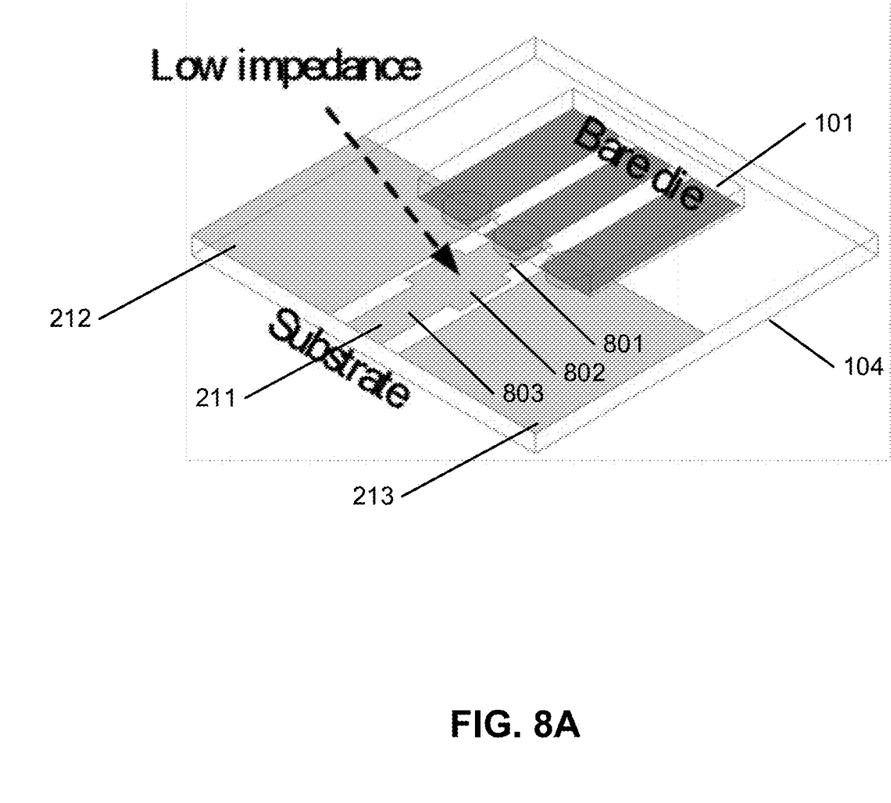
FIGS. 8A and 8B show perspective views of a flip chip IC device according to another embodiment of the invention.

Referring now to FIG. 8A, in one embodiment, a portion of signal strip 211 has been configured wider than the remaining strip to lower the overall impedance on the signal strip, which in turn compensates the high transmission line impedance. In this example, signal strip 211 includes a first section 801 (e.g., connector pad), a second section 802, and a third section 803 coupled to an electronic component disposed on substrate 104 (not shown). The width of second section 802 is wider than the width of first section 801 and/or third section 803. The specific wider width is configured dependent upon the mismatched overall impedance. In one embodiment, the length of second section 802 is short than or equal to a quarter wavelength (wavelength/4) corresponding to an operating frequency of the associated RF transceiver. By widening the signal strip 211, the impedance on signal strip 211 has been reduced. It in turn also narrows the gap between signal strip and ground strips 212-213.

Figure 8B:
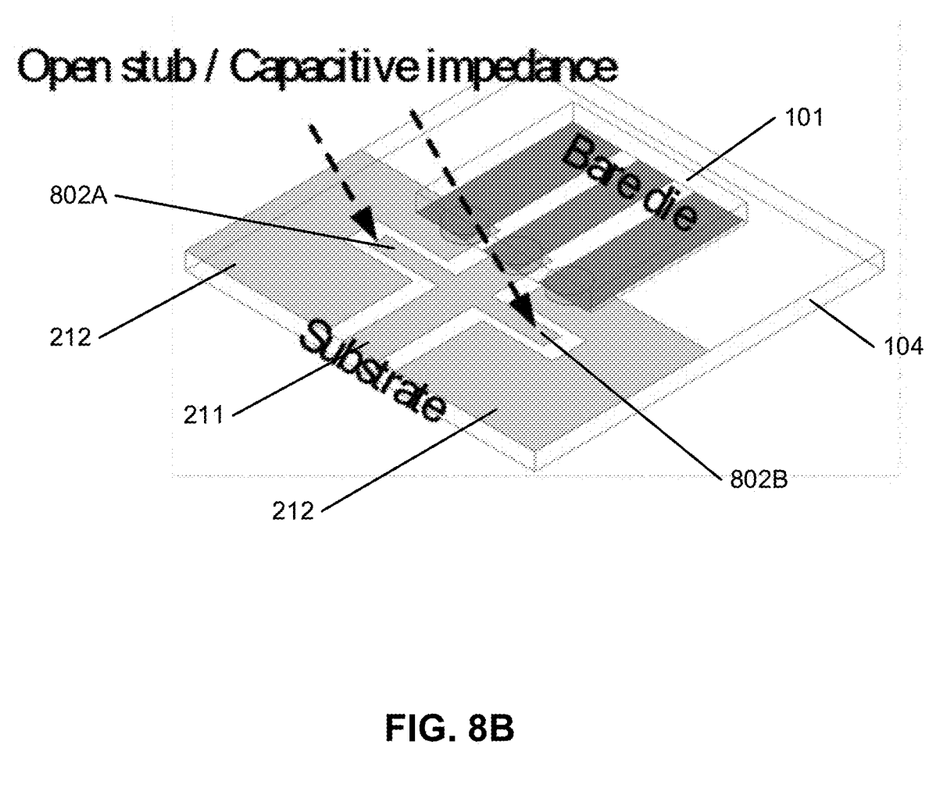

Alternative, according to another embodiment as shown in FIG. 8B, each of the ground strips 212-213 includes a cavity cut out from the strip. In addition, the wider section 802 of signal strip is further widened to form a first wing portion 802A and a second wing portion 802B. The wing portions 802A-802B extend into at least a portion of the cavities formed from ground strips 212-213, without electrically contacting the ground strips 212-213.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A flip-chip integrated circuit (IC) device utilized in radio frequency (RF) transceivers, the IC device comprising:
   a bare die having a plurality of metalized pads, each of the metalized pads having a solder ball deposited thereon; and
   a substrate having a plurality of connector pads connected to one or more electronic components disposed on the substrate via a plurality of connector strips, wherein the bare die is flipped up-side-down, such that the metalized pads are aligned and connected with the connector pads via the solder balls,
   wherein the at least one of the connector strips includes a strip section having an uneven strip width configured to compensate an impedance of a transmission line formed based on a connection between a metalized pad of the bare die and a connector pad of the substrate to match a predetermined impedance, wherein the connector strips comprise a signal strip, wherein the signal strip includes a first section coupled to a first connector pad of the substrate, a second section coupled to the first section, and a third sections coupled to the second section and one or more of the electronic components disposed on the substrate, and wherein a second strip width of the second section is narrower than a first strip width of the first section when the impedance of the transmission line is associated with inductive impedance.

2. The IC device of claim 1, wherein the connector strips comprise a first ground strip, a second ground strip, and the signal strip is disposed between the first ground strip and the second ground strip.

3. The IC device of claim 2, wherein the second strip width is different than the first strip width.

4. The IC device of claim 3, wherein the second strip width is different than a third strip width of the third section.

5. The IC device of claim 3, wherein a length of the second section is shorter than or equal to a quarter of a wavelength associated with an operating frequency of the RF transceiver.

6. The IC device of claim 3, wherein the first ground strip includes a first cavity cut out to increase a gap between the first ground strip and the signal strip, when the impedance of the transmission line is associated with inductive impedance.

7. The IC device of claim 6, wherein the second ground strip includes a second cavity cut out to increase a gap between the second ground strip and the signal strip.

8. The IC device of claim 7, wherein the first and second cavities are symmetrically disposed on opposite sides of the signal strip.

9. The IC device of claim 7, wherein a width of the first and second cavities is shorter than or equal to a quarter of a wavelength associated with an operating frequency of the RF transceiver.

10. The IC device of claim 3, wherein the second strip width of the second section is wider than the first strip width of the first section when the impedance of the transmission line is associated with capacitive impedance.

11. The IC device of claim 10, wherein a length of the second section is shorter than or equal to a quarter of a wavelength associated with an operating frequency of the RF transceiver.

12. The IC device of claim 10, wherein the first ground strip includes a first cavity cut out.

13. The IC device of claim 12, wherein the second ground strip includes a second cavity cut out.

14. The IC device of claim 13, wherein the first and second cavities are symmetrically disposed on opposite sides of the signal strip.

15. The IC device of claim 14, wherein a width of the first and second cavities is shorter than or equal to a quarter of a wavelength associated with an operating frequency of the RF transceiver.

16. A flip-chip Integrated circuit (IC) device utilized in radio frequency (RF) transceivers, the IC device comprising:
   a bare die having a plurality of metalized pads, each of the metalized pads having a solder ball deposited thereon, and
   a substrate having a plurality of connector pads connected to one or more electronic components disposed on the substrate via a plurality of connector strips, wherein the bare die is flipped up-side-down, such that the metalized pads are aligned and connected with the connector pads via the solder balls,
   wherein the at least one of the connector strips includes a strip section having an uneven strip width configured to compensate in impedance of a transmission line formed based on a connection between a metalized pad of the bare die and a connector pad of the substrate to match a predetermined impedance, wherein the connector strips comprise a first ground strip, a second ground strip, and a signal strip disposed between the first ground strip and the second ground strip, wherein the signal strip includes a first section coupled to a first connector pad of the substrate, a second section coupled to the first section, and a third section coupled to the second section and one or more of the electronic components disposed on the substrate, wherein the first ground strip includes a first cavity cut out, wherein the second section of the signal strip includes a first wing portion extended without contacting into the first cavity of the first ground strip.

17. The IC device of claim 16, wherein the second ground strip includes a second cavity cut out, wherein the second section of the signal strip includes a second wing portion extended without contacting into the second cavity of the second ground strip.

* * * * *